United States Patent
Roberson et al.

(10) Patent No.: US 10,355,485 B2
(45) Date of Patent: Jul. 16, 2019

(54) VARIABLE LOOP GAIN USING EXCESSIVE REGENERATION FOR A DELAYED WIDE-AREA CONTROL SYSTEM

(71) Applicant: UNIVERSITY OF WYOMING, Laramie, WY (US)

(72) Inventors: Dakota Roberson, Shelley, ID (US); John F. O'Brien, Laramie, WY (US)

(73) Assignee: University of Wyoming, Laramie, WY (US)

( * ) Notice: Subject to any disclaimer, the term of this patent is extended or adjusted under 35 U.S.C. 154(b) by 0 days.

(21) Appl. No.: 15/959,039

(22) Filed: Apr. 20, 2018

(65) Prior Publication Data
US 2018/0309292 A1    Oct. 25, 2018

Related U.S. Application Data

(60) Provisional application No. 62/487,500, filed on Apr. 20, 2017.

(51) Int. Cl.
| | | |
|---|---|---|
| *H02J 3/00* | (2006.01) | |
| *H02J 3/18* | (2006.01) | |
| *H02J 3/36* | (2006.01) | |
| *G01R 35/02* | (2006.01) | |

(52) U.S. Cl.
CPC ............. *H02J 3/18* (2013.01); *G01R 35/02* (2013.01); *H02J 3/36* (2013.01)

(58) Field of Classification Search
CPC ........ H02J 3/36; H02J 3/00; H02J 4/00; H02J 1/02; H02J 1/18; G01R 35/02; G05D 3/00; G05D 19/00; G05D 29/00
USPC ...... 322/20, 18, 24; 700/286, 288, 292, 297; 307/418
See application file for complete search history.

(56) References Cited

U.S. PATENT DOCUMENTS

| | | | | |
|---|---|---|---|---|
| 6,470,225 | B1 * | 10/2002 | Yutkowitz | G05B 11/28 700/188 |
| 8,688,287 | B2 * | 4/2014 | Khajehoddin | H02J 3/383 700/298 |
| 9,680,364 | B2 * | 6/2017 | Khajehoddin | H02J 3/383 |
| 10,177,647 | B2 * | 1/2019 | Wang | H02M 1/12 |

(Continued)

*Primary Examiner* — Julio C. Gonzalez
(74) *Attorney, Agent, or Firm* — Christopher P. Whitham; Samuel M. Freund; Cochran Freund & Young LLC

(57) ABSTRACT

Disclosed are methods and systems for adjusting a High Voltage Direct Current (HVDC) compensator output signal to an HVDC system to reduce control loop modulus due to excessive time delay of sensor measurements. Two different time windows, a Short-Time Variance Window (STVW) and an Extended-Time Variance Window (ETVW) may be examined for detection of increased energy. To detect increased energy the HVDC compensator output signal may be passed through a bandpass filter, then variances for the STVW and ETVW may be generated to produce corresponding test statistics. The STVW and ETVW test statistics may be compared to hypothesis test thresholds and have binary logic based on the hypothesis test comparisons used to generate a gain. The gain may then be multiplied times the original HVDC feedback compensator output such that the adjusted HVDC feedback compensator output reduces the control loop modulus when applied to the HVDC system.

20 Claims, 8 Drawing Sheets

500 INTERNAL BLOCK DIAGRAM FOR ERD BLOCK R(v) FOR AN EMBODIMENT

(56) References Cited

U.S. PATENT DOCUMENTS

| | | | | |
|---|---|---|---|---|
| 2011/0130889 A1* | 6/2011 | Khajehoddin | ......... | H02J 3/383 |
| | | | | 700/298 |
| 2012/0127009 A1* | 5/2012 | Pagnanelli | ........... | H03M 3/468 |
| | | | | 341/143 |
| 2012/0271475 A1* | 10/2012 | Wang | ....................... | H02J 3/14 |
| | | | | 700/295 |
| 2016/0308360 A1* | 10/2016 | Oates | ..................... | H02M 1/32 |
| 2017/0104343 A1* | 4/2017 | ElBsat | ..................... | H02J 3/32 |
| 2018/0100875 A1* | 4/2018 | Moheimani | ......... | G01Q 10/065 |

* cited by examiner

200 ONE-LINE DIAGRAM OF THE MINI-WECC MODEL OF THE WESTERN NORTH AMERICAN POWER SYSTEM

300 BLOCK DIAGRAM OF A FEEDBACK CONTROLLER FOR AN EMBODIMENT, INCLUDING THE ERD BLOCK $R(v)$

700 NYQUIST PLOT OF LOOP TRANSMISSION AND D(0.05, 1)

800 NYQUIST PLOT OF LOOP TRANSMISSION EXPERIENCING AN APPROXIMATED DELAY OF 205 MILLISECONDS AT $K = 0.25$

VARIABLE LOOP GAIN USING EXCESSIVE REGENERATION FOR A DELAYED WIDE-AREA CONTROL SYSTEM

CROSS REFERENCE TO RELATED APPLICATIONS

This application is based upon and claims the benefit of U.S. provisional application Ser. No. 62/487,500, filed Apr. 20, 2017, entitled "Variable Loop Gain using Excessive Regeneration Detection for a Delayed Wide-Area Control System," all of which is specifically incorporated herein by reference for all that it discloses and teaches.

STATEMENT REGARDING FEDERAL RIGHTS

This invention was made with government support under Grant No. DE-SC0012671, awarded by the U.S. Department of Energy to the University of Wyoming. The government has certain rights in the invention.

BACKGROUND OF THE INVENTION

High Voltage Direct Current (HVDC) electric power transmission systems use direct current for bulk transmission of electrical power, in contrast to the more common Alternating Current (AC) systems. For long-distance transmission, HVDC systems may be less expensive and suffer lower electrical losses. Long distance point-to-point HVDC transmission systems generally have lower overall investment cost and lower power losses than equivalent AC transmission systems. HVDC conversion equipment at the terminal stations may be costly, but the total HVDC transmission line costs over long distances are lower than an AC line of the same distance. Further, HVDC requires less conductor per unit distance than an AC line, as there is no need to support three phases as is typical of an AC transmission line and, also unlike an AC transmission line, for HVDC transmission lines there is no skin effect (e.g., the tendency of AC current to become distributed within a conductor such that the current density is largest near the surface of the conductor, and decreasing with greater depths into the conductor). For underwater power cables, HVDC avoids the heavy currents required to charge and discharge the cable capacitance of each AC cycle.

HVDC transmission may also be selected for other technical benefits. HVDC allows power transmission between unsynchronized AC transmission systems. Since the power flow through an HVDC link can be controlled independently of the phase angle between source and load, it can stabilize a network against disturbances due to rapid changes in power generation/consumption. HVDC also allows transfer of power between grid systems running at different frequencies, such as 50 Hz and 60 Hz AC systems. This improves the stability and economy of each network, by allowing exchange of power between incompatible networks. Moreover, HVDC power flow between separate AC systems may be automatically controlled to support either network during transient conditions, but without the risk that a major power system collapse in one network will lead to a collapse in the second network. HVDC improves power system controllability. With at least one HVDC link embedded in an AC grid, the controllability feature may be particularly useful where control of energy trading is desired.

While for shorter distances the higher cost of DC conversion equipment compared to an AC system may still be justify the use of an AC transmission system, due to the benefits of HVDC transmission, the addition of HVDC transmission to the electric grid may help create a less costly and more stable overall electric power system.

SUMMARY OF THE INVENTION

An embodiment of the present invention may comprise a method for adjusting a High Voltage Direct Current (HVDC) feedback compensator block output signal to an HVDC system in order to reduce control loop modulus due to excessive time delay of sensor measurements used to calculate a feedback error signal received by a HVDC feedback compensator block, wherein the HVDC compensator block operations are performed on a control unit, the method comprising: receiving by an Excessive Regeneration Detector (ERD) block R(v) the HVDC feedback compensator block output signal v(t) from the HVDC feedback compensator block C(s), wherein the ERD block R(v) operations are performed on the control unit; discretizing by a Discretize subsystem of the ERD block R(v) the HVDC feedback compensator block output signal v(t) to create a discretized feedback compensator output signal v[n]; filtering by a Bandpass Filter subsystem of the ERD block R(v) the discretized feedback compensator output signal v[n] to produce a bandpass frequency limited compensator output signal $v_f[n]$; calculating by an Overall Variance subsystem of the ERD block R(v) an overall HVDC system variance $\hat{\sigma}^2$ over an overall HVDC system window of the discretized feedback compensator output signal v[n]; calculating by a Short-Time Variance Window (STVW) Variance subsystem of the ERD block R(v) a STVW bandpass filtered variance $\hat{\sigma}_{1,f}^2$ over a short-time variance window of the bandpass frequency limited compensator output signal $v_f[n]$; calculating by a STVW Divider subsystem of the ERD block R(v) a STVW quotient $g_1[n]$ of the STVW bandpass filtered variance $\hat{\sigma}_{1,f}^2$ divided by the overall HVDC system variance $\hat{\sigma}^2$; calculating by an Extended-Time Variance Window (ETVW) Variance subsystem of the ERD block R(v) an ETVW bandpass filtered variance $\hat{\sigma}_{2,f}^2$ over an extended-time variance window of the bandpass frequency limited compensator output signal $v_f[n]$; calculating by an ETVW Divider subsystem of the ERD block R(v) an ETVW quotient $g_2[n]$ of the ETVW bandpass filtered variance $\hat{\sigma}_{2,f}^2$ divided by the overall HVDC system variance $\hat{\sigma}^2$; comparing by a Hypothesis Test subsystem of the ERD block R(v) the STVW quotient $g_1[n]$ and the ETVW quotient $g_2[n]$ to corresponding STVW threshold $\gamma_1$ and ETVW threshold $\gamma_2$, respectively, as administration of hypothesis tests; setting by a Binary Logic subsystem of the ERD block R(v) based on results of the hypothesis tests administered by the Hypothesis Test subsystem a variable gain K[n] to unity (i.e., 1) for an Interval I state when neither the STVW quotient $g_1[n]$ nor the ETVW quotient $g_2[n]$ exceed the corresponding STVW threshold $\gamma_1$ and ETVW threshold $\gamma_2$, respectively; setting by the Binary Logic subsystem based on the results of the hypothesis tests the variable gain K[n] to a value that is a function of the STVW quotient $g_1[n]$ and a slope $m_1$ and intercept $b_1$ of a first desired gain rate of change line for Interval II and III states when the STVW quotient $g_1[n]$ exceeds the corresponding STVW threshold $\gamma_1$ irrespective of whether or not the ETVW quotient $g_2[n]$ exceeds the corresponding ETVW threshold $\gamma_2$; setting by the Binary Logic subsystem based on the results of the hypothesis tests the variable gain K[n] to a value that is a function of the STVW quotient $g_1[n]$ and a slope $m_2$ and intercept $b_2$ of a second desired gain rate of change line for an Interval IV state when the ETVW quotient $g_2[n]$ exceeds the corresponding ETVW threshold $\gamma_2$ and the STVW quotient $g_1[n]$ does not exceed the corresponding STVW threshold $\gamma_1$; smoothing by a Smoothing subsystem of the ERD block R(v) the variable gain K[n] with a smoothing filter as a moving average over a smoothing time window in order to provide for slower variation of the variable gain K[n]; multiplying by a Multiplier the HVDC feedback compensator block output signal v(t) times the variable gain K[n] in order to obtain an adjusted HVDC feedback compensator output signal $v_a(t)$, wherein the Multiplier operations are performed on the control unit; and operating the HVDC system in accord with the adjusted HVDC feedback compensator block output signal $v_a(t)$ from the Multiplier.

An embodiment of the present invention may further comprise a Wide-Area Damping Control (WADC) system that adjusts a High Voltage Direct Current (HVDC) feedback compensator block output signal to an HVDC system in order to reduce control loop modulus due to excessive time delay of sensor measurements used to calculate a feedback error signal received by a HVDC feedback compensator block, wherein the HVDC compensator block operations are performed on a control unit of the WADC system, the WADC system comprising: the control unit, the control unit further comprising: an Excessive Regeneration Detector (ERD) block R(v) that receives the HVDC feedback compensator block output signal v(t) from the HVDC feedback compensator block C(s), the Excessive Regeneration Detector (ERD) block R(v) further comprising: a Discretize subsystem that discretizes the HVDC feedback compensator block output signal v(t) to create a discretized feedback compensator output signal v[n]; a Bandpass Filter subsystem that filters the discretized feedback compensator output signal v[n] to produce a bandpass frequency limited compensator output signal $v_f[n]$; an Overall Variance subsystem that calculates an overall HVDC system variance $\hat{\sigma}^2$ over an overall HVDC system window of the discretized feedback compensator output signal v[n]; a Short-Time Variance Window (STVW) Variance subsystem that calculates a STVW bandpass filtered variance $\hat{\sigma}_{1,f}^2$ over a short-time variance window of the bandpass frequency limited compensator output signal $v_f[n]$; a STVW Divider subsystem that calculates a STVW quotient $g_1[n]$ of the STVW bandpass filtered variance $\hat{\sigma}_{1,f}^2$ divided by the overall HVDC system variance $\hat{\sigma}^2$; an Extended-Time Variance Window (ETVW) Variance subsystem that calculates an ETVW bandpass filtered variance $\hat{\sigma}_{2,f}^2$ over an extended-time variance window of the bandpass frequency limited compensator output signal $v_f[n]$; an ETVW Divider subsystem that calculates an ETVW quotient $g_2[n]$ of the ETVW bandpass filtered variance $\hat{\sigma}_{2,f}^2$ divided by the overall HVDC system variance $\hat{\sigma}^2$; a Hypothesis Test subsystem that compares the STVW quotient $g_1[n]$ and the ETVW quotient $g_2[n]$ to corresponding STVW threshold $\gamma_1$ and ETVW threshold $\gamma_2$, respectively, as administration of hypothesis tests; a Binary Logic subsystem that sets, based on results of the hypothesis tests administered by the Hypothesis Test subsystem, a variable gain K[n] to unity (i.e., 1) for an Interval I state when neither the STVW quotient $g_1[n]$ nor the ETVW quotient $g_2[n]$ exceed the corresponding STVW threshold $\gamma_1$ and ETVW threshold $\gamma_2$, respectively; the variable gain K[n] to a value that is a function of the STVW quotient $g_1[n]$ and a slope $m_1$ and intercept $b_1$ of a first desired gain rate of change line for Interval II and III states when the STVW quotient $g_1[n]$ exceeds the corresponding STVW threshold $\gamma_1$ irrespective of whether or not the ETVW quotient $g_2[n]$ exceeds the corresponding ETVW threshold $\gamma_2$; and the variable gain K[n] to a value that is a function of the STVW quotient $g_1[n]$ and a slope $m_2$ and intercept $b_2$ of a second desired gain rate of change line for an Interval IV state when the ETVW quotient $g_2[n]$ exceeds the corresponding ETVW threshold $\gamma_2$ and the STVW quotient $g_1[n]$ does not exceed the corresponding STVW threshold $\gamma_1$; and a Smoothing subsystem that smoothes the variable gain K[n] with a smoothing filter as a moving average over a smoothing time window in order to provide for slower variation of the variable gain K[n]; and a Multiplier that multiplies the HVDC feedback compensator block output signal v(t) times the variable gain K[n] in order to obtain an adjusted HVDC feedback compensator output signal $v_a(t)$; and the HVDC system that operates in accord with the adjusted HVDC feedback compensator block output signal $v_a(t)$ from the Multiplier.

DETAILED DESCRIPTION OF THE EMBODIMENTS

Figure 1:
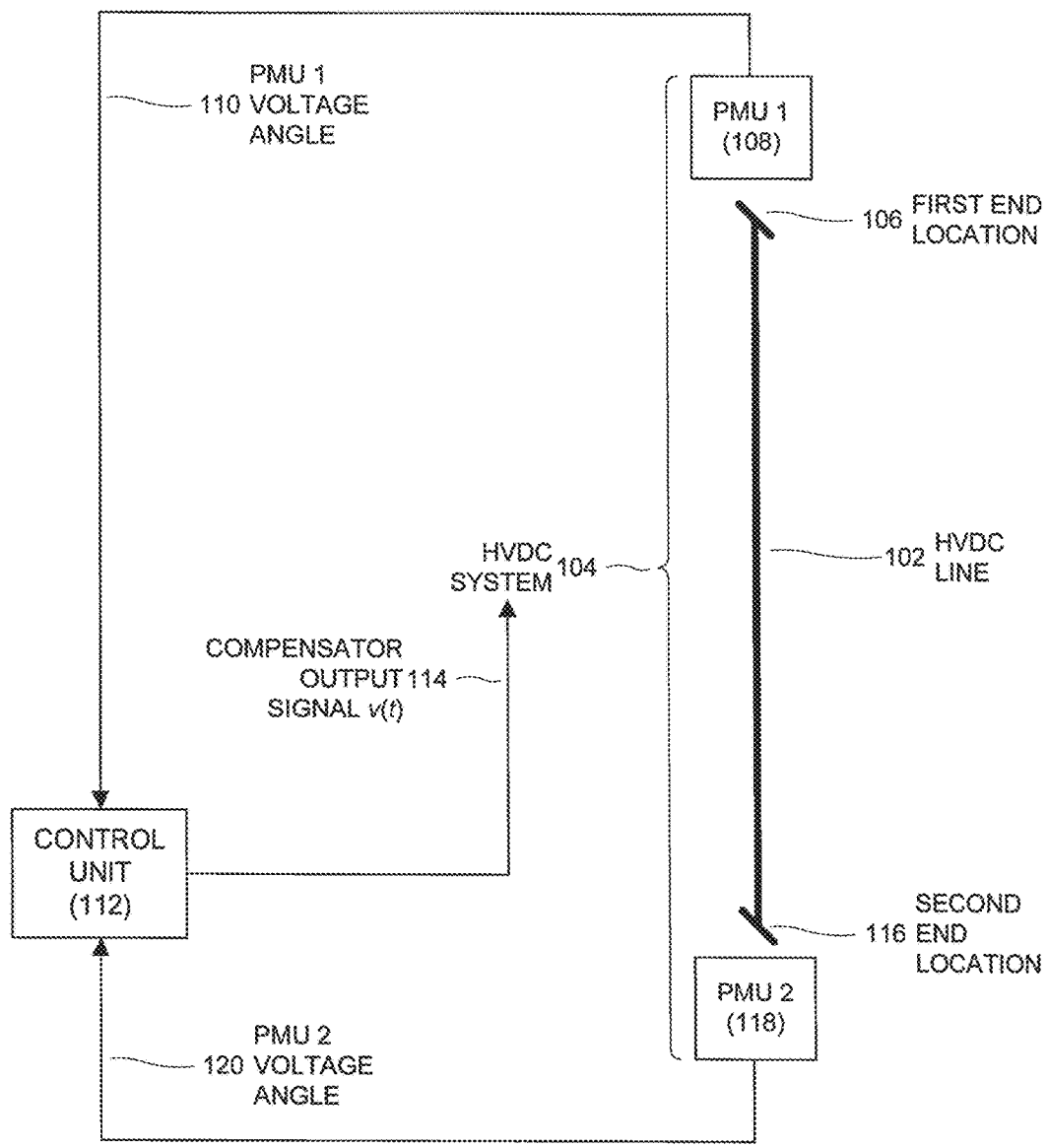
FIG. 1 is a block diagram of a structural implementation for an embodiment.

The interconnection between separate Alternating Current (AC) networks with a Direct Current (DC) does not come without some real-world difficulties. The typical DC link for this type of system is implemented with a High Voltage Direct Current (HVDC) connection for the typical advantage that higher voltages mean lower currents for power transmission, which is particularly helpful for long distance power transmission. For example, for a real world HVDC link between AC networks, Wide-Area Damping Controllers (WADCs) are required for stabilization of large interconnected grids with separate generating and load centers which may exhibit significant resonant characteristics and high renewable generation penetration. Excessive time delay in the implementation of a WADC may lead to poor time-domain response or instability of an otherwise stable closed loop system. Time delay in WADCs is a threat to stability and performance of carefully designed control systems. Due to the distributed nature of such WADC systems and multi-purpose utility of remote sensing equipment used in Wide-Area Measurement Systems (WAMS), time delay may take many forms. For example, network congestion due to unusually high traffic may contribute tens of milliseconds or more, while sampling using analog-to-digital converters may cause a constant delay of several milliseconds.

More insidious contributors of time delay may come in the form of a cyber-attack or GPS spoofing offensive where delay is slowly introduced to the system by a hacker. For example, by taking over a Global Positioning System (GPS)-synchronized clock and slowly adjusting time stamps (such as GPS timestamps being used to coordinate sensor readings between two sensors located a large geographic distance from each other), an enemy may be able to gradually introduce phase into the control system without detection. This phase is added to various other sources of delay in the system, including network congestion and transportation delay. Consequently, even a conservatively designed system may be destabilized due to excessive time delay. Regardless of the sources and negative impacts of time delay, WADCs will be required in the anticipated smart grid of the future.

Time delay may be addressed using several methods. For instance, time delay may be addressed by direct measurement of latency and subsequent adaptive lead compensation. Time delay may be addressed by a controller designed assuming large constant delay utilizing the Smith-predictor found for a WADC system. Time delay may be addressed by determining the maximum delay that a closed loop system may sustain while retaining stability and develop a lead-lag controller using the maximum delay criteria. Time delay may be addressed by adaptive control techniques that may be applied related to significant plant parameter variation, packet-loss and stochastic time delay. Time delay may be addressed by fuzzy logic control that may be useful to accommodate parameter variation and operating point changes, as well as continuous communication delays.

Embodiments presented herein propose a system that permits the closed loop system response itself to be sufficient to illustrate the impact of excessive time delay. Therefore, for the embodiments presented herein, the compensation approach is not a function of assumptions related to delay, including ability to measure delay, assumed delay patterns, or a constantly delayed system. As such, the detection and control approach considered herein is insensitive to any such considerations which may or may not be available to a control designer. GPS spoofing attacks attempting to slowly introduce delay are foiled for slowly introduced delays, allowing for additional action to be taken (e.g. switching to backup Phasor Measurement Units—PMUs—located at different locations, etc.) while maintaining stability of the system. Additionally, for the embodiments presented herein, minimum phase compensation is not utilized to combat the nonminimum phase contributed by delay directly, which allows a strict bandwidth to be enforced.

The following disclosure is organized as follows: Section 1 identifies control performance indices and terminology used to describe the control methodology. Section 2 describes the linear and nonlinear features of the overall system as well as the system used to model, design, and test the WADC and variable loop gain methodology. A description of time delay in its various forms is in Section 3. The Excessive Regeneration Detector (ERD) is discussed in Section 4. The Circle criterion is utilized to prove absolute stability of the controller in Section 5. Detailed nonlinear simulations which evaluate performance in various disturbance environments and delayed conditions are summarized in Section 6, with conclusions discussed in Section 7.

Section 1: Control Performance Indexes and Terminology

Rational function T(s) of the Laplace variable s is the loop transmission (alternatively return ratio) of a feedback loop. Frequency $\omega_b$, where $|T(j\omega_b)|=1$, is the control bandwidth (alternatively 0 dB crossover frequency). $|F(s)|=|1+T(s)|$ is the feedback. $|F(s)|>1$, $|F(s)|<1$, and $|T(s)|<<1$ define negative, positive and negligible feedback, respectively. $|F(s)|>>1$ defines large feedback. These definitions indicate the effect of feedback on the logarithmic response of the closed loop system to disturbances. Regeneration is the effect of positive feedback on disturbances, including actuator effort at or near the crossover frequency which does not serve to stabilize or reject disturbance. Nonminimum phase is the phase lag not found using the Bode phase/gain relationship. When comparing two systems, the system with larger feedback in a particular frequency band will be superior in the rejection of disturbance in that band. For continuous time linear system with impulse response h(t) and delay $\tau_d$, the Laplace transform of the delayed system $h(t-\tau_d) \rightarrow e^{-s\tau_d} H(s)$. Random variable Z is normally distributed with mean θ and standard deviation σ, denoted $Z \sim N(\theta, \sigma)$ (where N is meant to represent the set of all natural numbers).

Section 2: Control System Architecture

FIG. 1 is a block diagram 100 of a structural implementation for an embodiment. The HVDC system 104 is comprised of at least two Phasor Measurement Units (PMUs) (PMU 1 (108) and PMU 2 (118)) and the HVDC transmission line 102. The HVDC system also comprises the equipment necessary to respond to the compensator output signal v(t) 114 in the operation of the HVDC system 104. The PMUs (108, 118) reside at opposite ends (106, 116) of the HVDC transmission line 102 and measure/sense the phase angle at each corresponding end (106, 116) of the HVDC transmission line 102. Thus, PMU 1 (108) resides at the first end location 106 and measures the phase angle of the HVDC transmission line 102 at the first end location 106 of the HVDC transmission line 102 and PMU 2 (118) resides at the second end location 116 and measures the phase angle of the HVDC transmission line 102 at the second end location 116 of the HVDC transmission line 102.

The control unit 112 is a device (or devices operating together) capable of performing the logic and/or mathematical functions necessary to implement the control embodiments disclosed herein. The control unit 112 device(s) hardware may be co-located with one of the PMUs (108, 118) if so desired by a system designer. Alternatively, the control unit 112 may be located anywhere that may receive the PMU voltage angle signals (110, 120) from the PMUs (108, 118) and communicate the compensator output signal v(t) 114 to the HVDC system 104. The PMUs (108, 118) may communicate the PMU voltage angles (110, 120) to the control unit (112) over any electronic communication pathway capable of transmitting the PMU voltage angle (110, 120) data, including proprietary communications systems, public networks (e.g., the Internet), wireless networks, fiber-optic cables, etc. Similarly, the compensator output signal v(t) 114 to the HVDC system 104 may also be communicated over any electronic communication pathway capable of transmitting the PMU voltage angle (110, 120) data, including those mentioned above for the PMU voltage angle (110, 120) communications. Each communication pathway for the PMU 1 voltage angle 110, the PMU 2 voltage angle 120, and the compensator output signal v(t) 114 may use all the same, some of the same, or all different communication pathways to the control unit 112 device(s).

The various embodiments may provide the control and management functions detailed herein for the control unit 112 via an application operating on one or more computing devices/systems. The control unit may each be a computer or computer system, or any other electronic devices device capable of performing the communications and computations of an embodiment. The device/devices that comprise the control unit 112 may include but are not limited to: a general purpose computer, a laptop/portable computer, a tablet device, a smart phone, an industrial control computer, a data storage system controller, a CPU, a Graphical Processing Unit (GPU), an Application Specific Integrated Circuit (ASI), and/or a Field Programmable Gate Array (FPGA). Embodiments may be provided as a computer program product which may include a computer-readable, or machine-readable, medium having stored thereon instructions which may be used to program/operate a computer (or other electronic devices) or computer system to perform a process or processes in accordance with the various embodiments. The computer-readable medium may include, but is not limited to, hard disk drives, floppy diskettes, optical disks, Compact Disc Read-Only Memories (CD-ROMs), Digital Versatile Disc ROMS (DVD-ROMs), Universal Serial Bus (USB) memory sticks, magneto-optical disks, ROMs, random access memories (RAMs), Erasable Programmable ROMs (EPROMs), Electrically Erasable Programmable ROMs (EEPROMs), magnetic optical cards, flash memory, or other types of media/machine-readable medium suitable for storing electronic instructions. The computer program instructions may reside and operate on a single computer/electronic device or various portions may be spread over multiple computers/devices that comprise a computer system. Moreover, embodiments may also be downloaded as a computer program product, wherein the program may be transferred from a remote computer to a requesting computer by way of data signals embodied in a carrier wave or other propagation medium via a communication link (e.g., a modem or network connection, including both wired/cabled and wireless connections).

Additionally, while the details described herein for embodiments may describe a methodology that may be embodied as a method or process, another embodiment may be recognized as a computer system. Further, in describing the computer system(s) that performs operations and/or transfers data, one, or more, individual processes described above for the methodology may be broken down and represented as a subsystem of the overall control system. A subsystem of the control system may be assigned, in whole or in part, to a particular hardware implemented system, such as a dedicated Application Specific Integrated Circuit (ASIC) or Field Programmable Gate Array (FPGA). One or more subsystems, in whole or in part, may alternatively be implemented as software or firmware instructions defining the operation of a computer system with specific regard to the one or more subsystems implemented as software or firmware instructions. The software or firmware instructions may cause the Central Processing Unit, memory, and/or other systems of a computer system to operate in particular accordance with the particular one or more subsystems designated features.

Also, various embodiments may implement the network/bus communications for the PMU 1 voltage angle 110, the PMU 2 voltage angle 120, and/or the compensator output signal v(t) 114 using any communications channel capable of transferring the electronic data. For instance, the network/bus communication connection(s) may be an Internet connection routed over one or more different communications channels during transmission. Likewise, the network/bus communication connection may be an internal communications bus of a computing device, or even the internal bus of a processing or memory storage Integrated Circuit (IC) chip, such as a memory chip or a Central Processing Unit (CPU) chip. The network/bus communication channel may utilize any medium capable of transmitting electronic data communications, including, but not limited to: wired communications, wireless electro-magnetic communications, fiber-optic cable communications, light/laser communications, sonic/sound communications, etc., and any combination thereof of the various communication channels.

While the primary examples for the Wide-Area Damping Controller (WADC) are with regard to a HVDC grid intertie (particularly the Pacific Direct Current Intertie—PDCI), the various embodiments will also address delay event concerns for other systems, such as renewable energy generation systems such as Photo Voltaics (PVs) and Wind Turbines.

Figure 2:
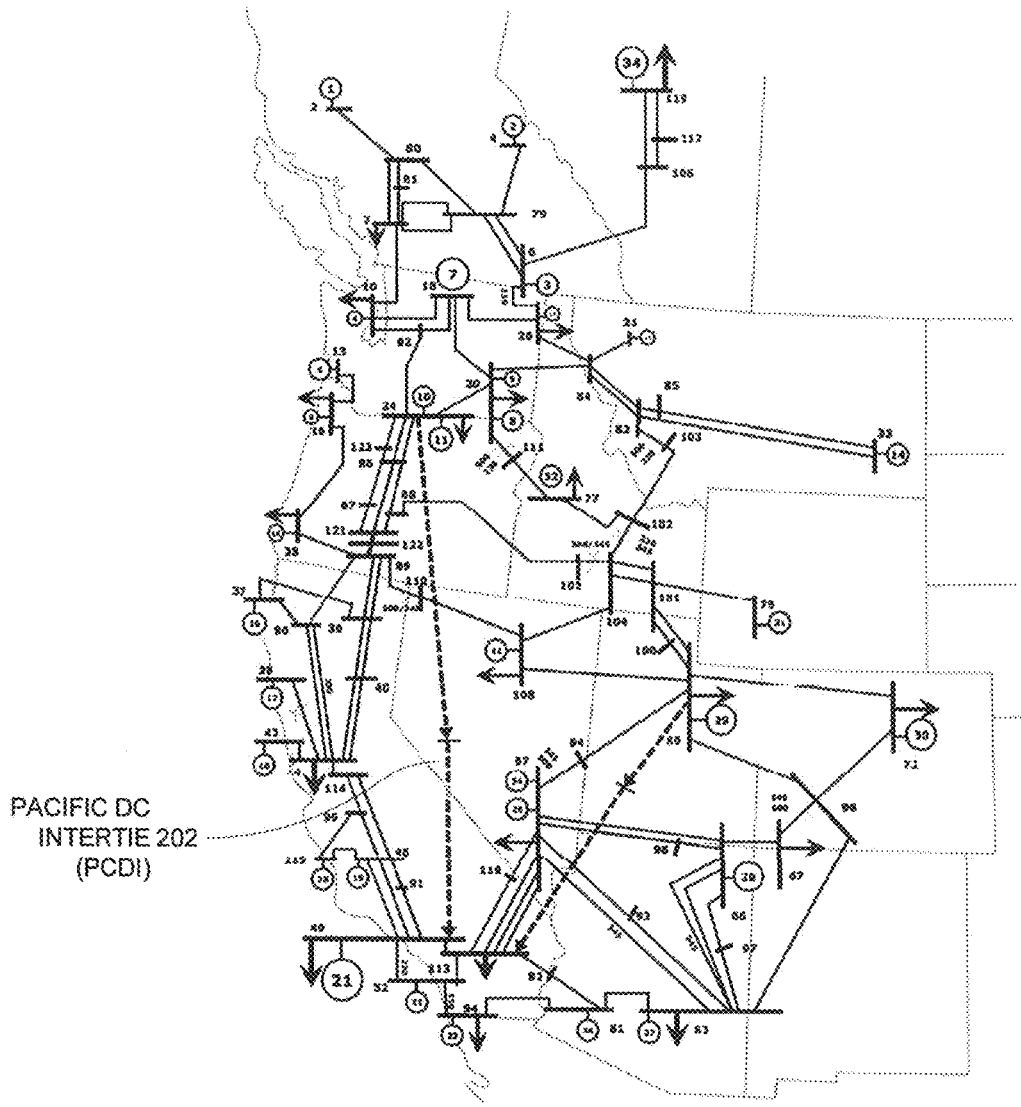
FIG. 2 is one-line diagram of the miniWECC model of the Western North American Power System.

FIG. 2 is one-line diagram 200 of the miniWECC model of the Western North American Power System showing example grid intertie applications on a real-world system. The PDCI 202 is shown in the one-line diagram 200 and will be used herein as an example HVDC system for the embodiments. Additionally, due to its potential stability-threatening inter-area oscillatory characteristics and the historic small-signal instability event in August of 1996, comprehensive system identification of the wNAPS has been carried out. As such, a model replicating the major components of the system was developed, named the miniWECC model, and implemented in the open-source Power System Toolbox (PST) software in MATLAB. The miniWECC model contains 122 buses, 34 generators, 2 DC lines, 171 AC transmission lines to model the significant elements of the wNAPS, as shown in FIG. 2.

Figure 3:
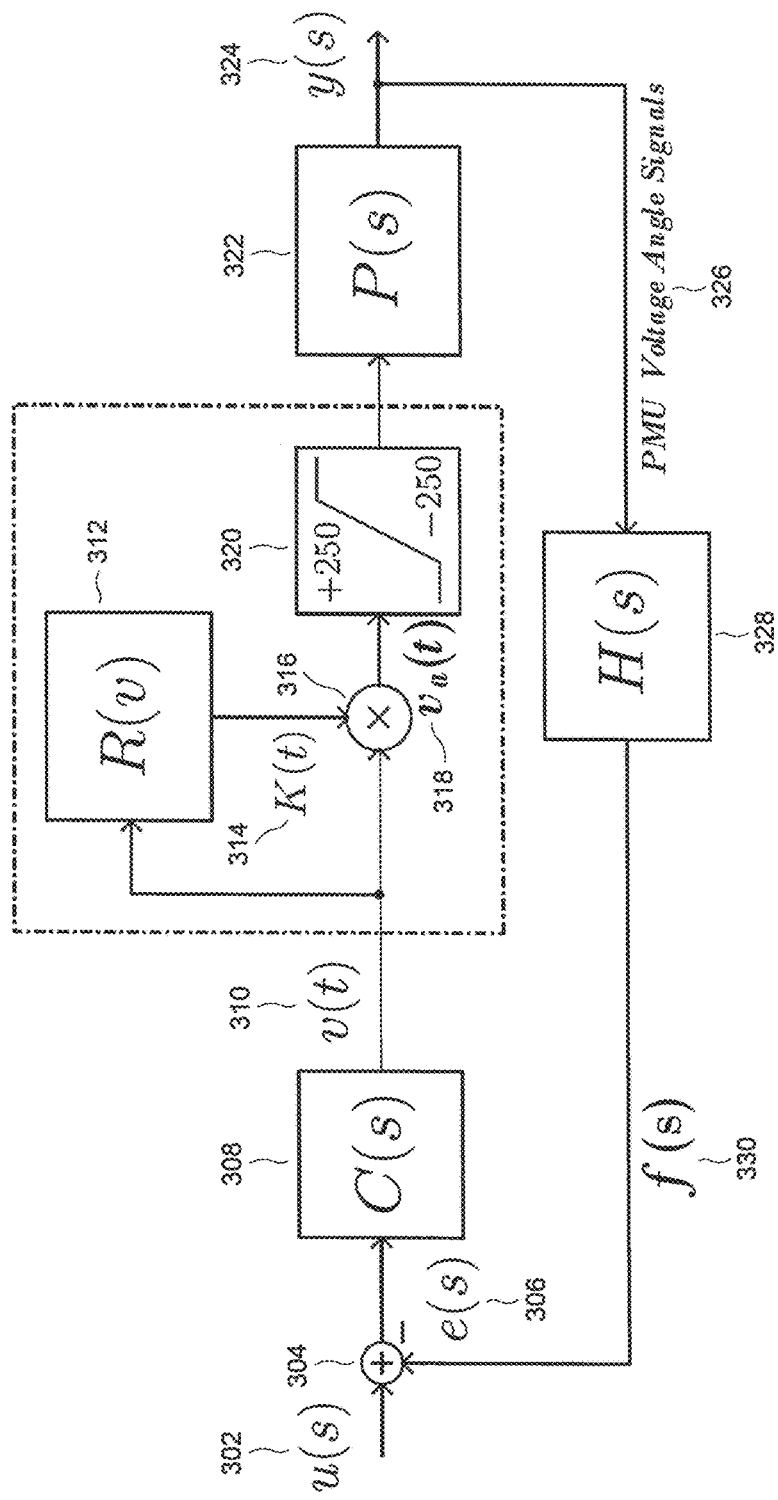
FIG. 3 is a block diagram of a feedback controller for an embodiment, including the Excessive Regeneration Detector (ERD) block R(v).

FIG. 3 is a block diagram 300 of a feedback controller for an embodiment, including the Excessive Regeneration Detector (ERD) block R(v) 312 (which includes a variable gain engine as part of the implementation). The reference signal u(s) 302 is sometimes also called the setpoint/setpoint value for the control loop and represents the desired operational value for the control system. Typically, the reference signal u(s) 302 is assigned by a system user to meet a desired outcome of the system for the system user. The reference signal u(s) 302 of the feedback control system 300 of FIG. 3 represents a desired derivative of end-to-end differences of voltage angles for the HVDC system (e.g., 104 of FIG. 1) being controlled. Other than the operations of the HVDC system (104 of FIG. 1) as described by the transfer function P(s) 322 and the PMU voltage angle signals 326 from the PMU units (108, 118 of FIG. 1), the operations/calculations of the control loop features shown in FIG. 3 (i.e., 304-320, 328, & 330) are performed by the control unit (112 of FIG. 1) discussed in more detail above. At an Error Calculation Subtractor subsystem 304, the feedback signal f(s) 330 is subtracted from the reference signal u(s) 302 in order to obtain error signal e(s) 306. The feedback control signal f(s) 330 represents a measurement of the actual derivative of the end-to-end differences of voltage angles y(s) 324 for the HVDC system represented by transfer function P(s) 322. The error signal e(s) 306 is passed through HVDC feedback compensator block C(s) 308 resulting in the HVDC feedback compensator block output signal v(t) 310. The HVDC feedback compensator block C(s) 308 may be any type of feedback compensator system utilized for controlling operation of the HVDC system P(s) 322 when delay disturbances are not present.

Embodiments of the invention may employ the Excessive Regeneration Detector (ERD) block R(v) 312 (which includes a variable gain engine as part of the implementation) to adjust the HVDC feedback compensator block output signal v(t) 310 in order to reduce the control loop modulus resulting from excessive time delay of sensor measurements 326, regardless of the source of the time delays. Further, the ERD block R(v) 312 of the various embodiments operates such that the ERD block R(v) 312 does not require a priori (i.e., prior) knowledge of the characteristics of the time delays such that the ERD block R(v) 312 will operate effectively against both anticipated types of delay disturbances as well as unanticipated/unknown types of delay disturbances and, accordingly, the various embodiments incorporating the ERD block R(v) 312 provide a much more robust response to delay disturbances than a model based control algorithm that attempts to model delay disturbance impacts and/or other control schemes that have operations based on assumptions of particular types of delay disturbance characteristics.

The ERD block R(v) 312 receives the HVDC feedback compensator block output signal v(t) 310 from the HVDC feedback compensator block C(s) 308. The ERD block R(v) 312 performs the excessive regeneration detection and variable gain operations (see below with respect to the disclosure discussing at least FIGS. 5 & 6) resulting in gain K(t) 314. The Multiplier 316 multiplies the HVDC feedback compensator block output signal v(t) 310 from the HVDC feedback compensator block C(s) 308 times the gain K(t) 314 from ERD block R(v) 312 resulting in an adjusted HVDC feedback compensator block output signal $v_a(t)$ 318. Saturation limit 320 indicates the real-world saturation limits of an HVDC line (e.g., as shown in FIG. 3, the saturation limit is ±250 MW as is the case for the example PDCI discussed throughout this disclosure). The saturation limit 320 may vary from HVDC system to HVDC system and is not relevant to the theoretical operation of the ERD detector block R(v) 312 of the various embodiments. The adjusted HVDC feedback compensator block output signal $v_a(t)$ 318 is sent to the HVDC system represented in FIG. 3 as transfer function P(s) 322. The HVDC system transfer function P(s) 322 operates in accord with the adjusted HVDC feedback compensator block output signal $v_a(t)$ 318 resulting in an output of the actual (or for test systems, the modelled) derivative of the end-to-end differences of voltage angles y(s) 324 for the HVDC system represented by transfer function P(s) 322.

The PMUs (108, 118 of FIG. 1) deliver the PMU voltage angle signals 326 measured at each end (106, 116 of FIG. 1) of the HVDC line (102 of FIG. 1) to the PMU Transfer Function block H(s) 328 of the control unit (112 of FIG. 1). The PMU Transfer Function block H(s) 328 calculates the feedback control signal f(s) 330 representing the measurement of the actual derivative of the end-to-end differences of voltage angles y(s) 324 for the HVDC system represented by transfer function P(s) 322 used to calculate error signal e(s) 306.

For the model of the PCDI example system used in testing, the transfer function P(s) 322 is an $11^{th}$ order linear input-output transfer function model approximation from the northern end of the Pacific DC Intertie (PDCI), located at the Celilo substation near The Dalles, Oreg., to the southern end located at the Sylmar substation just north of Los Angeles, Calif. The output y(s) 324 of the transfer function P(s) 322 is the derivative of the difference of voltage angles at either end of the HVDC line corresponding to the input of active power flow on the PCDI line. Transfer function P(s) 322 of PDCI is relative degree zero, minimum phase with collocated zero-pole pairs and a bandpass shape around the inter-area modal frequencies.

Phasor measurement units (PMUs) located at either end of the PDCI provide sensing for the voltage angles 326 used in the feedback configuration transfer function H(s) 328. The PMU dynamics of transfer function H(s) 328 for the PDCI model are modeled as a pair of critically damped poles at 10 Hz. Recent upgrades to the Celilo and Sylmar converter stations suggest that linear dynamics in the range of inter-area oscillatory frequencies are negligible. The DC line of the PDCI is, however, subject to a saturation of 250 MW. Careful consideration of all limitations outlined above suggests a control bandwidth of no more than 4 Hz.

The compensator transfer function C(s) 308 for the example PDCI controller embodiment is shown in eq. 1.

$$C(s) = 3600 \frac{(s+8)(s^2+1.5s+2.25)}{(s+2)(s+12)(s^2+1.8s+4)} \qquad \text{Eq. 1}$$

Figure 4:
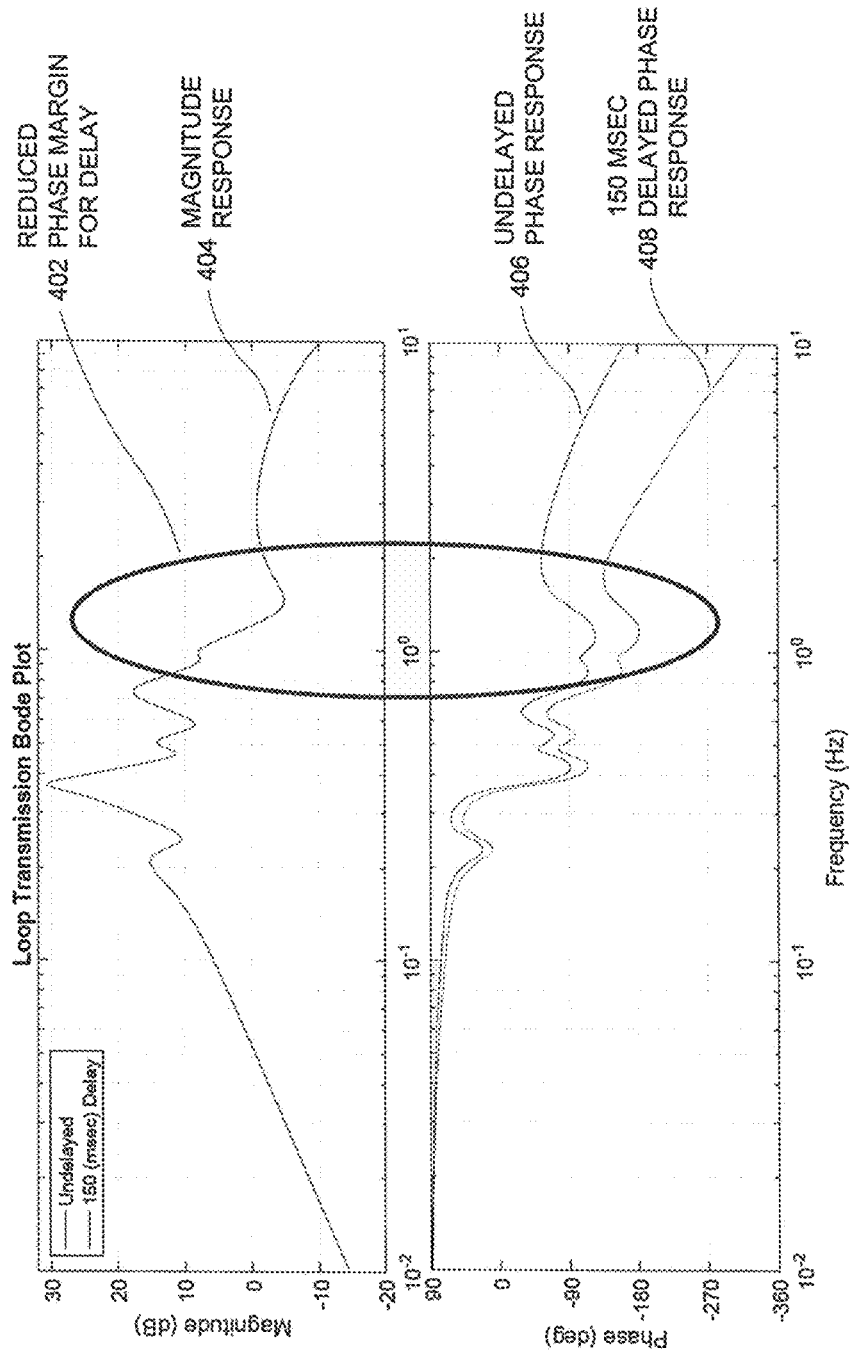
FIG. 4 is a bode plot of loop transmission functions for the minimum phase and approximated 150 millisecond delayed system.

FIG. 4 is a bode plot 400 of loop transmission functions for the minimum phase and approximated 150 millisecond delayed system of the example PDCI controller embodiment with the compensator transfer function C(s) 308 described in eq. 1. The magnitude response curve is shown by 404, the undelayed phase response curve is shown by 406, and the 150 millisecond delayed phase response curve is shown by 408. The area showing the onset of the reduced phase margin for the delay is indicated by the area in circle 402.

Section 3: Impact of Time Delay

Due to the distributed nature of the Wide-Area Control System (WACS) controller, multiple sources of delay are of concern. Expected sources of delay in a WACS controller of this architecture include but are not limited to: (1) Discretization (i.e. sampling); (2) Internal PMU protocol; (3) Signal transportation lag from disparate sensor locations; (4) Network delay; and (5) PMU Spoofing or similar cyberattack. Item (1) is deterministic, as the amount of time required for sampling in the real-time digital controller implementation will contribute 30 milliseconds of delay. Item (2) is understood to have a stochastic distribution to its delay characteristic, with each sample delayed between 30 and 80 milliseconds. The contributors of delay related to the distributed nature of the control system, items (3) and (4), are less well known; they are assumed non-negligible and may exceed 50 milliseconds. In total, delay is assumed to be 80 milliseconds, with a standard deviation of 20 milliseconds, although significantly higher delays may be experienced for short-term events.

Item (5) Cyber-attacks and GPS spoofing have the potential to extract additional phase from the controller in a difficult-to-detect fashion and may exhibit the most threatening characteristics to the automatic control system with fixed bandwidth. Hackers who manipulate the timing of collocated GPS units may arbitrarily remove phase from the system maliciously. Slowly drifting the clock away from the true time value in a smooth manner is difficult to detect on the front-end (as opposed to large step changes in time) and will eventually create a system which is unstable in closed loop. Deployed WADCs must be asked to withstand such an attack.

Nonminimum phase due to delay $\tau_d$ is linear with frequency f, i.e., $\theta_{\tau_d} = -2\pi f \tau_d$. FIG. 4 depicts the loop transmission function T(s) and a second-order Padè approximation. The un-delayed closed loop control system has significant margins of stability, and it is noted that PDCI type control systems require conservative design in order to ensure sufficient time-domain responses and reliable operation. This design consideration is corroborated by extensive controller testing for large contingency events. If the system is designed with insufficient phase margin and/or a source of significant nonminimum phase near the crossover frequency(s) is introduced (e.g. significant time delay), spectral content of the output signal (i.e. v(t) 310 of FIG. 3)

in the frequency range of the loop transmission near unit gain will be significant. This is known as regeneration; its genesis and effects are concepts used as the underpinning to detect and repair a system which has begun to regenerate excessively.

Section 4: Excessive Regeneration Detector (ERD)

As described in Section 3 above, v(t) (310 of FIG. 3) will have substantial energy in the band of frequencies near crossover if the system is experiencing excessive time delay. Exploiting this characteristic of delayed systems in feedback connection, a detection mechanism of an embodiment is developed to reduce loop modulus in the delayed condition. The detection technique and subsequent statistical characterization follows.

A. Detection Methodology

Figure 5:
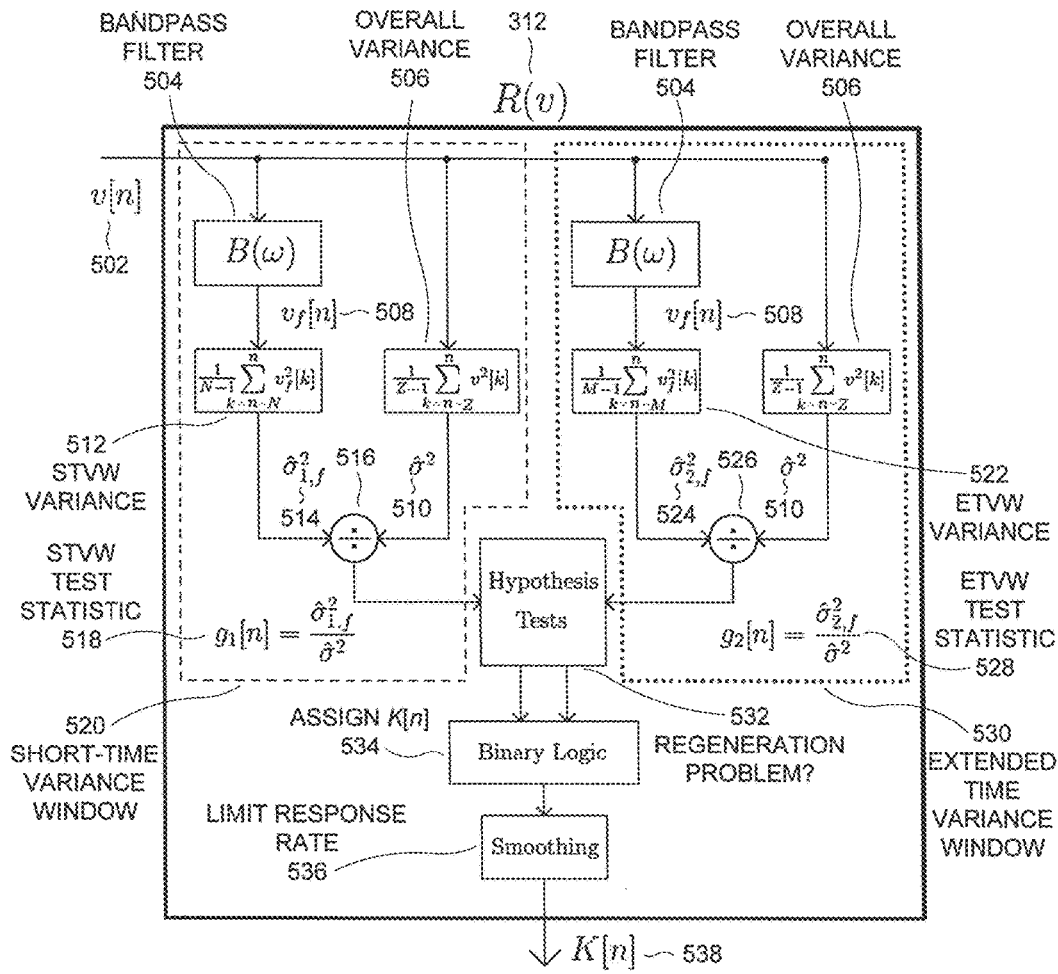
FIG. 5 is an internal block diagram for ERD block R(v) for an embodiment.

FIG. 5 is an internal block diagram 500 for ERD block R(v) 312 (which includes a variable gain engine as part of the implementation) for an embodiment. As shown in FIG. 3, the input to the detector block R(v) 312 is the compensator output signal v(t) (310 from FIG. 3) discretized to v[n] 502 where the discretizing process is performed by a Discretize subsystem of the ERD block R(v) 312 (not shown). Detection of excessive regeneration is described in the discrete time domain in this section by applying a statistical hypothesis test similar to the classical energy detector. To detect excessive regeneration, the ERD block R(v) 312 must be sensitive to energy in the band of frequencies near the crossover of the controller. To that end, the discretized feedback compensator output signal v[n] 502 is passed through a bandpass filter $\beta(\omega)$ 504 with passband 0.85-4.0 Hz (for the PDCI example system discussed herein). Comparatively high energy in the passband band of frequencies suggests regeneration due to excessive phase lag near the controller crossover frequency, as described above in Section 3.

Two branches (520, 530) are shown in FIG. 5. Each branch (520, 530) illustrates one of two different time windows which will be examined for an increase in energy. The Short-Time Variance Window (STVW) branch 520 is near the dominant time constant of the HVDC system so that it is capable of detecting rapid increases in energy in the band of interest and is encircled in the dashed box 520 of FIG. 5. The Extended-Time Variance Window (ETVW) branch 530 is roughly an order of base ten magnitude longer than the STVW branch 520 and is less sensitive to rapid energy increases. The ETVW branch 530 is encircled in a dotted box in FIG. 5. The ETVW branch 530 functions to detect longer-term changes in energy which are related to the recovery of the system from excessive time delay. While gain reintroduction may be performed using only a single-length variance window, performance is increased substantially with the dual window (520, 530) approach of FIG. 5, as shown in simulation in Section 6-A below.

Implementation of each of the branches (520, 530) is similar. Each branch (520, 530) passes the discretized feedback compensator output signal v[n] 502 through the bandpass filter $\beta(\omega)$ subsystem 504 to obtain the bandpass frequency limited compensator output signal $v_f[n]$ 508. Each branch (520, 530) also calculates an overall HVDC system variance $\hat{\sigma}^2$ 510 using an Overall Variance estimation subsystem 506. While FIG. 5 shows each branch having a separate bandpass filter $\beta(\omega)$ subsystem 504 and Overall Variance estimation subsystem 506, the subsystems (504, 506) provide the same results (508, 510, respectively) and in an embodiment may be implemented just once for both branches (520, 530). The two subsystems (504, 506) are shown separately in each branch (520, 530) to make FIG. 5 easier to follow and to show the symmetry between the two branches (520, 530). The similarities between the STVW branch 520 and the ETVW branch 530 continue with the calculation of the STVW bandpass filtered variance $\hat{\sigma}_{1,f}^2$ 514 and the ETVW bandpass filtered variance $\hat{\sigma}_{2,f}^2$ 524 at STVW Variance subsystem 512 and ETVW Variance subsystem 522, respectively. For each of the STVW bandpass filtered variance $\hat{\sigma}_{1,f}^2$ 514 and the ETVW bandpass filtered variance $\hat{\sigma}_{2,f}^2$ 524 the filtered compensator output signal $v_f[n]$ 508 is squared and summed from sample (n−N) to the current time n in the STVW branch 520 and from (n−M) in the ETVW branch 530, for M≈10N. Thus, an estimate of the variance (514, 524, 510) of the filtered (508) and unfiltered (502) signals are obtained for each branch (520, 530). At a Divider subsystem (STVW Divider 516, ETVW Divider 526) of each branch (520, 530), the quotient (518, 528) of the filtered variance (514, 524) to the overall system variance (510) is calculated as the test statistic, $g_1[n]$ 518 and $g_2[n]$ 528. The term in the denominator, an estimate of the unfiltered variance 510 of the output signal 502, ensures that the detector is less sensitive to an increase or decrease in overall system energy due to random load changes or other system reconfiguration. The sample length Z is significantly greater, on the order of at least half an order of base ten magnitude greater, than N and M so that the overall variance 510 sensitivity is only to that of slowly changing disturbance levels.

At the Hypothesis Test subsystem 532, two simple hypothesis tests are administered for the test statistics (514, 524) described above, one for each length variance window (520, 530). The hypothesis tests of the Hypothesis Test subsystem 532 are performed to determine if there is a currently occurring regeneration problem.

$$H_{0,i}:v[n]=w[n],$$

$$H_{1,i}:v[n]=s[n]+w[n] \qquad \text{Eq. 2}$$

Eq. 2 represents the hypothesis tests 532 where $H_{0,i}$ is the null hypothesis of the $i_{th}$ test, $H_{1,i}$ is the alternative hypothesis for the $i_{th}$ test, w[n] is a wide-sense stationary (WSS) signal with variance $\sigma^2$ and s[n] is an additive signal with finite variance $\sigma_s^2$. Each test statistic $g_i[n]$(518, 528) is compared to its corresponding threshold $\gamma_i$, for i=1, 2, in eq. 3 to produce the set of appropriate binary sequences used in the Binary Logic block subsystem 534 in FIG. 5.

$$g_i = \frac{\hat{\sigma}_{i,f}^2}{\hat{\sigma}^2} > \gamma_i \qquad \text{Eq. 3}$$

The Binary Logic block 534 is required to assign a value for the variable gain K[n]538. It should be noted that the variable gain K[n] 538 represents the same entity as the variable gain K(t) 314 in FIG. 3. In real time, K(t) 314 will make step changes as the discrete variable gain K[n] 538 changes value for each n at the sampling frequency for n Development of the set of rules by which K[n] 538 will be assigned adheres to several policies. First, false alarms are of secondary importance to ensuring detection of all possible regeneration. Second, when excessive regeneration is detected, remove gain from the system rapidly. Third, return to normal operation slowly. The development of these policies are derived from a requirement to err on the side of caution; remove gain from the controller if a persistent regeneration problem exists and reestablish nominal gain only after the threat has been removed. The logic required to set the gain value by the piecewise linear functions used in the assignment of K[n] 538 is given in eq. 4 below.

Interval I (602):$K[n]=1, H_{0,1}$ accept|$H_{0,2}$ accept

Interval II (604):$K[n]=m_1 g_1[n]+b_1, H_{0,1}$ reject|$H_{0,2}$ accept

Interval III (606):$K[n]=m_1 g_1[n]+b_1, H_{0,1}$ reject|$H_{0,2}$ reject

Interval IV (608):$K[n]=m_2 g_1[n]+b_2, H_{0,1}$ accept|$H_{0,2}$ reject  Eq. 4

Note that Intervals II (604) and III (606) assign K[n] 538 identically irrespective of whether $H_{0,2}$ is accepted or rejected. The entities $m_1$ and $m_2$ are slopes associated with the desired rate of change of gain and $b_1$ and $b_2$ are the corresponding intercepts. Typically $m_1$ should be less than $m_2$. The minimum value for the variable gain strategy is limited to K[n]=0.25 and is a significant limit which will be discussed in Section 5 below. The final block in the ERD block 312 is a smoothing filter 536 (i.e. moving average (MA) in the discrete implementation) to provide slow variation in gain (i.e., limit the response rate). In the fourth condition of eq. 4, a slightly longer smoothing window is introduced to slow recovery further. The final K[n] 538 of the ERD block 312 is provided from the smoothing filter 536.

Figure 6:
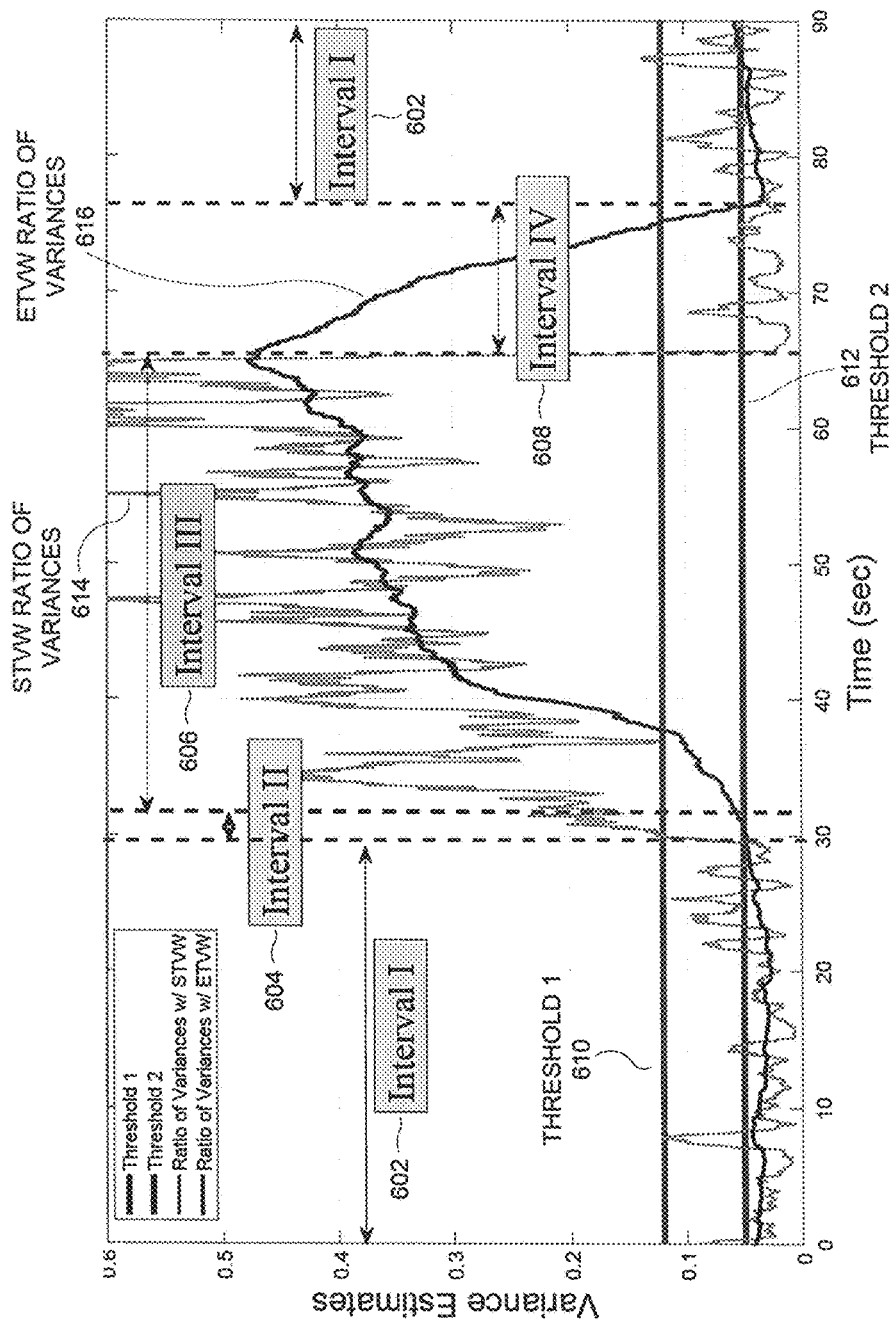
FIG. 6 is an example realization of a delay event with onset at 30 seconds that depicts the four intervals used in setting the variable gain.

Individual intervals described in eq. 4 must be justified according to the design goals described previously. FIG. 6 is an example realization of a delay event with onset at 30 seconds that depicts the four intervals used in setting the variable gain. FIG. 6 shows the above hypothesis test logic, with each of the intervals I-IV (602-608) labeled. Threshold 1 is shown as line 610, threshold 2 is shown as line 612, the STVW ratio of variances (i.e., $g_1[n]$ 518 from FIG. 5) is shown as curve 614, and the ETVW ratio of variances (i.e., $g_2[n]$ 528 from FIG. 5) as curve 616. The first interval 602 suggests that neither hypothesis test indicates gain reduction of the controller, so K[n] 538 remains unity. However, if the STVW branch 520 null hypothesis $H_{0,1}$ is rejected, the gain 538 is decreased at slope $m_1 < m_2$. This is independent of whether or not the ETVW branch 530 hypothesis test has suggested an increase of variance in the band of frequencies of interest, as in intervals I and II. However, if $H_{0,1}$ is accepted while the ETVW alternative hypothesis $H_{0,2}$ remains rejected, interval IV suggests a situation in which the controller output v[n] 502 is transitioning back to normal operating conditions and the variable gain K[n] 538 must be returned slowly to the unit value. Note that the assignment of K[n] 538 does not allow for a reduction of more than 12 dB of the original loop transmission.

B. Characterization of Hypothesis Tests

Probability of detection ($P_d$) for a given threshold and probability of false alarm ($P_{fa}$) are often of interest if a closed-form statistical distribution for the random variable of the test statistic is available. Limited assumptions are made regarding the signal structure of s[n], which makes the detector resemble the classical energy detector (i.e. variance estimate compared to a threshold determined a priori).

Modification to the classical energy detector has been made to desensitize it to variations in broadband excitation (e.g. noise floor increase). By normalizing the variance estimate of the filtered signal by the variance estimate of its unfiltered counterpart, the prescribed desensitization is achieved. Statistical analysis is significantly complicated by such normalization and exact distributions of the test statistics $g_1[n]$ and $g_2[n]$ are not readily available. Mild assumptions are considered to achieve a tractable probability statement related to the performance of the detector.

Assume Z>>M and Z>>N. For Z sufficiently large, the distribution of the denominator term (i.e. broadband energy estimate) of the test statistic has variance sufficiently small that it may be considered a scaling constant. Thus, let the probability of false alarm be represented by eq. 5 below.

$$P_{fa} = pr\left\{ \frac{\hat{\sigma}_{i,f}^2}{\hat{\sigma}^2} \geq \gamma_i \,\bigg|\, H_{0,i} \right\} \approx pr\{\hat{\sigma}_{i,f}^2 \geq c\gamma_i \mid H_{0,i}\} \quad \text{Eq. 5}$$

Note in eq. 5 the threshold for the $i_{th}$ test is effectively scaled by constant c. This assumption allows the detector presented here to be interpreted as the classical energy detector with the threshold $\gamma_i$ simply scaled by the broadband energy of the signal.

While rescaling the detection threshold holds for large record lengths, the statistical distribution of $\hat{\sigma}_{i,f}^2$ is not available for the calculation of probabilities. The ERD input signal v[n] is colored by the system P(s), compensator C(s), sensor H(s) and bandpass filter $\beta(\omega)$, greatly complicating analysis of the statistical characteristics of the signal. A full derivation of this test statistic is outside the scope of this work and may be a topic for future research. Thus, theoretical $P_{fa}$ statistics are unobtainable in closed form and will be replaced by Monte Carlo analysis in Section 6 below.

In order to select thresholds $\gamma_i$, the standard deviation of the test statistic under the null hypothesis (i.e. no delay) is calculated for a significant number of samples to determine a baseline estimate. The threshold is then set at 1 standard deviation above this value. Hence, a conservative approach is again taken in order to satisfy the requirement that no detections are missed with the sacrifice of an increased rate of false alarm. However, a momentary decrease in loop gain is of little concern to controller stability or performance, as shown in Section 5 below.

Section 5: Stability Analysis

The example PDCI feed compensator is fourth-order and stable by Nyquist. Analysis presented here focuses on stability of the ERD/variable gain system and the maximum time delay for which the system retains stability for min(K (t)).

A. Circle Criterion Analysis of the Variable Gain Controller

The variable gain K(t) is in the interval [0.25,1.0]. The lower bound is the result of analysis of the PDCI compensator applied in a multivariable system that indicates a 12 dB drop in loop gain delivers reasonable performance (20 dB of modulus at the 0.35 Hz mode). The ERD/variable gain system and the PDCI saturation element with limits of ±250 MW are together the nonlinearity $\psi(t, v(t))=\text{sat}_{\pm 250}(K(t) v(t))$ connected in feedback to a linear system described by loop transmission function $T(s)=C(s)H(s)P(s)$ (the subscript represents the saturation limits).

Consider a minimal state space realization {A,B,C} of the stable, strictly proper loop transmission function T(s)=y(s)/u(s) (i.e. $\dot{x}(t)=Ax(t)+Bu(t)$, y(t)=Cx(t), A Hurwitz, (A,B) controllable, (A,C) observable). This system is in feedback connection with a memoryless nonlinear system $u=-\psi(t, y)$. Nonlinearity $\varphi$: $[0,\infty] \times R \rightarrow R$ (where R is meant to represent the set of all real numbers) satisfies the sector condition if:

$$(\varphi(t,y)-K_{min}y)(\varphi(t,y)-K_{max}y) \leq 0, \forall y \in \Gamma \quad \text{Eq. 6}$$

where $K_{max} > K_{min}$ and interval F contains the origin. $\psi(\cdot)$ that satisfies eq. 6 is said to belong to sector [$K_{min}, K_{max}$]

over finite domain Γ (globally if Γ=R, the set of real numbers). If the origin x=0 of this feedback system is asymptotically stable for all nonlinearities in the sector $[K_{min}, K_{max}]$, the system is said to be absolutely stable over this sector.

The feedback connection is absolutely stable if $T_T(s)= T(s)/(1+K_{min}T(s))$ is Hurwitz and $Z_T(s)=(1+K_{max}T(s))/(1+K_{min}T(s))$ is strictly positive real. This is the SISO Circle Criterion which has an accommodating graphical representation. Define $D(K_{min}, K_{max})$ as the disk plotted in the T-plane whose diameter is the line segment connecting points $-K_{min}^{-1}+j0$ and $-K_{max}^{-1}+J0$. The feedback connection is absolutely stable if the Nyquist plot of T(s) does not enter or encircle the disk $D(K_{min}, K_{max})$ ($0<K_{min}<K_{max}$).

Figure 7:
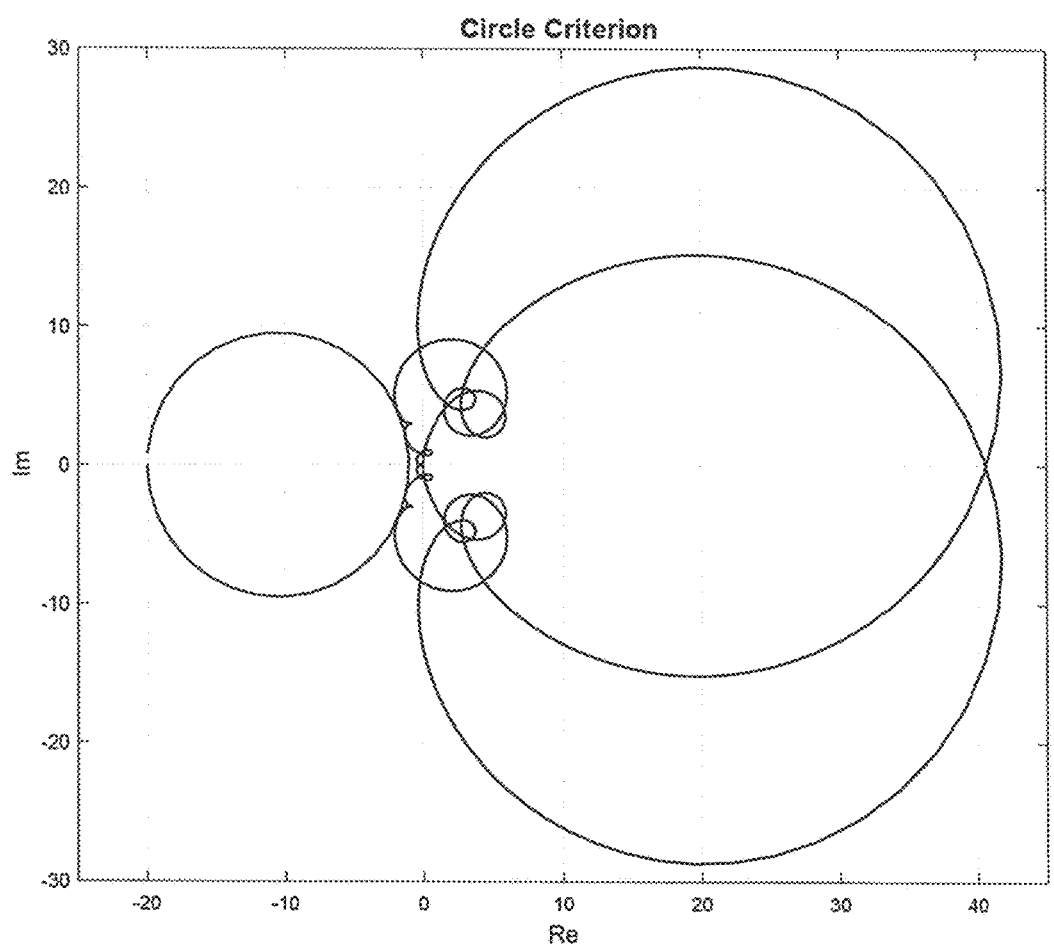
FIG. 7 is a Nyquist plot of loop transmission and D(0.05, 1).

FIG. 7 is a Nyquist plot 700 of loop transmission and D(0.05, 1). FIG. 7 shows the Nyquist plot of the PDCI loop transmission function T(s)=C(s)H(s)P(s) and the disk D(0.05,1); the system is absolutely stable for the sector [0.05,1]. The nonlinearity ψ is a saturation and thus the system is absolutely stable over a finite domain. For K=1 (maximum variable gain), this corresponds to domain |v(t)|<5,000; for K=0.25 (minimum variable gain), this corresponds to |v(t)|<20,000.

A. Maximum Time Delay at Minimum Gain for Stability

Figure 8:
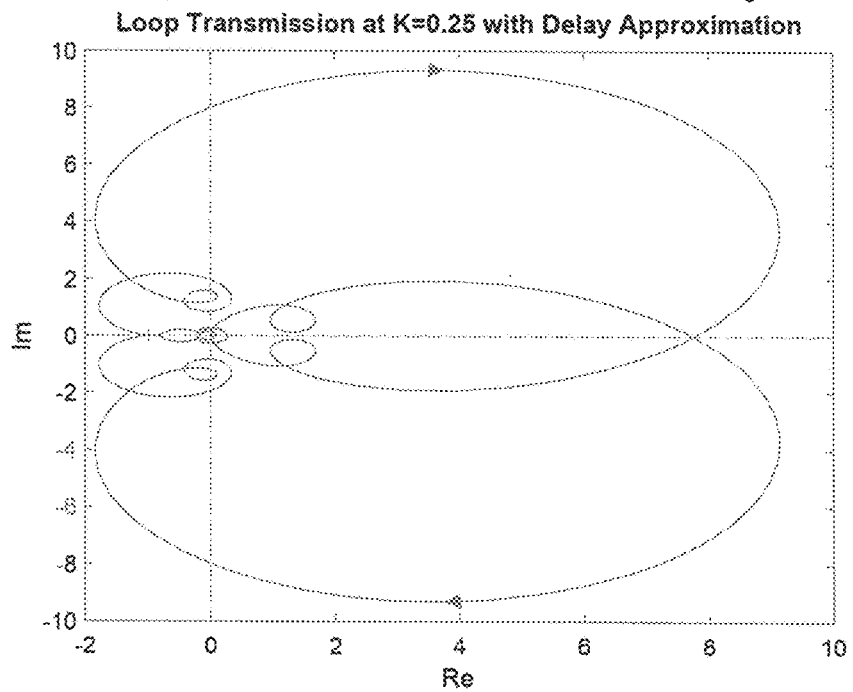
FIG. 8 is a Nyquist plot of loop transmission experiencing an approximated delay of 205 milliseconds at K=0.25.

A Padè approximation of a 205 millisecond time delay is applied to the loop transmission function with K=0.25 (the bandwidth is at its lowest and thus can support the maximum time delay). The Nyquist plot of this function shown in FIG. 8. FIG. 8 is a Nyquist plot of loop transmission experiencing an approximated delay of 205 milliseconds at K=0.25 and indicates that this is the limit of stability.

Section 6: Case Studies

Simulations are carried out with Power System Toolbox in MATLAB utilizing the miniWECC model with one-line diagram shown in FIG. 2. To demonstrate the efficacy of the ERD, five separate scenarios are investigated. The system is first subjected to a constant delay of 250 milliseconds, considered an extreme case. Next, a stochastic delay is introduced. Then, a test scenario with varying system noise levels and latency conditions is shown to demonstrate the ERDs insensitivity to changing disturbance power, in a broadband sense, as well as the severity of the gain reduction under multiple delayed events. A transient simulation is considered before subjecting the system to a cyberattack in the form of PMU spoofing. This is implemented in the form of a slow, linear increase in delay with PMU-generated burst events.

Parameters are set as follows: $m_1=-500$, $m_2=-400$, N=1 second, M=12N=12 seconds, and Z=60 seconds. The thresholds are set so as to achieve a probability of false alarm rate of 1 in 100 samples, on average. An example test run of false alarms where the threshold is exceeded by the test statistic $g_1[n]$ several times. However, the system is insensitive to these alarms since the variable loop gain configuration requires excessive regeneration for several samples before loop transmission is reduced appreciably.

A. Constant Delay Time

The system experiencing a constant delay of 250 milliseconds causes the ERD to rapidly decrease gain to the lower limit, allowing the system to move to a stable operating condition. As the STVW of length 1 second begins to lose energy in the buffer, the ETVW of length 12 seconds retains significant energy, allowing the system to attempt recovery to the full gain condition at a slower rate than gain was removed. However, significant regeneration shifts the gain back down to the lower limit rapidly, and the trend repeats itself with mean 0.485 for the two minute interval.

Thus, the average gain of the system is reduced by roughly 6 dB in the constant delay case. Note that the system modeled by the full nonlinear simulation is capable of functionality with 250 milliseconds, slightly more than originally identified using linear analysis (205 milliseconds, as in FIG. 8). The error signal e(t) is also much improved.

As foreshadowed in Section 4-A, asymmetric windowing (i.e. both STVW and ETVW vs. only STVW) improves performance by allowing for a slower recovery from excessive regeneration, which in turn decreases standard deviation of the feedback signal. There was roughly a factor of two reduction of standard deviation of e[n] and nearly a factor of three is realized over the closed loop system without the ERD in place.

B. Random Delay

The impact of the assumed stochastic nature of the delay is investigated. Instead of a fixed delay, the delay $\tau_d$ at sample k in the discrete-time implementation is an independent, identically distributed random variable with distribution $\tau_d[k] \sim N(0.15,0.02)$ (units are seconds) (where N is meant to represent the set of all natural numbers). This represents the delay assumed in Section 3 with an additional bias of 70 milliseconds.

Random delay adds enough phase to force the ERD to reduce gain. The average gain across the interval in the test is 0.67, with a reduction of about 13% standard deviation in the error signal. This test provides evidence that the detection, gain removal, and gain recovery methods described in Section 4-A together mitigate the threat of a substantial random delay. These results are quite similar to those of the constant gain case due to the aggregate phase contribution by the mean of the delay.

C. Varying Disturbance Power and Time Delay

Normalizing the test statistic by the overall system energy reduces the detectors' sensitivity to load variations outside of the band of frequencies near crossover. The tests performed are to show the system's response to various disturbance and time delay conditions. Interval $T_1$ is the nominal case where no delay is experienced.

Let $D_1$ and $D_2$ represent disturbance powers related to the variance of overall system load such that $D_2=1.1\ D_1$. Thus, a 10% increase in disturbance power is introduced slowly, beginning at time t=30 and is complete by the start of the second interval at t=90. The system is experiencing no time delay in interval $T_2$. Note that a momentary reduction of roughly 10% occurs with recovery to nominal gain shortly thereafter due to a false alarm. A 100 millisecond delay (i.e. 1 standard deviation from assumed delay) is introduced at time t=120, resulting in a reduction of gain which cycles several times for the next 120 seconds. The mean of K[n] is 0.8 in this condition until the delay is increased to 240 milliseconds at t=240, in interval $T_4$. The sample mean then decreases to 0.52 and the gain never fully recovers to unit gain. The delay is removed and the system returns to the nominal condition in interval $T_5$. There was a roughly 12% and 54% reduction in standard deviation in the intervals $T_3$ and $T_4$, respectively.

D. Transient Simulation

To test the ERD methodology in a transient power system event, a 3-phase-to-ground fault is applied to a west coast, high-capacity 500 kV transmission line oriented in the north-south direction parallel to the western seaboard. The transmission lines that make up this corridor are often termed the California-Oregon Intertie (COD, and they are responsible for significant transmission from hydro-generation in the north to large load centers in the south.

Variable gain K(t), PDCI power output, and a sample line flow are tested for a nominal constant delay of 200 milliseconds in two of the scenarios. A single case with no delay, indicates that a brief reduction of gain is followed by a smooth gain recovery. Note that this temporary removal of gain from the un-delayed system is a slight trade-off in damping performance for providing the ability to absorb delay and retain stability without excessive regeneration at the crossover frequency. Delay of the feedback signal by $\tau_d$=200 milliseconds without ERD causes significant oscillatory regenerative content in the PDCI actuator signal. This extra actuation does not contribute to damping oscillations in line flows and generator speeds throughout the system.

E. GPS Spoofing and Burst Delay Events

Compelling motivation related to the GPS spoofing of PMU sensors is simulated with a slow linear increase in time delay. This sort of time delay is compelling due to its difficulty to measure on the front end as it presents itself simply as clock drift. Additionally, burst events which are known delays caused by internal PMU processing are applied once per 30 second interval. It is of utmost importance to emphasize that no model is assumed, the time delay is not measured directly in the ERD method, and no assumptions are made related to the model of the spoof attack.

The mean of K(t) decreases as a function of the spoofing delay, as expected. Without ERD, the system is incapable of withstanding such an attack and diverges at the t=100 seconds mark. Thus, the system retains functionality despite cyber-attacks for delays which end at slightly less than 400 milliseconds. It is noted that the system is incapable of absorbing arbitrarily large delays and additional action may be required when the system experiences such significant delay. Momentary bursts in delay have minimal impact on the system and the full nonlinear system is capable of handling more time delay than linear analysis suggests in Section 5.

Section 7: Conclusion

The ERD methodology presented to augment stability due to high latency in wide-area damping systems shows promise for retaining sufficient margins of stability in the system by smoothly shifting the gain of the system when stability threats arise. It is capable of withstanding sustained delays of up to 250 milliseconds by varying the gain between 0 and −12 dB (slightly more delay than is indicated by linear analysis). More realistically, the ERD functions well in the presence of varying time delays in the interval of $\tau_d \in [0,200]$ milliseconds; this interval subsumes the reasonable values of delay that the system may encounter in normal operating conditions based upon the outlined delaying characteristics of the WADC in Section 3. Normalization of the test statistic by a slowly-varying estimate of broadband disturbance power effectively desensitizes the variable loop gain algorithm to slow changes in disturbance power. Stability of the variable loop gain system is shown using the Circle criterion.

Finally, spoof attacks of the PMU sensor with the introduction of clock drift, as shown in cyber-attacks recently discussed in the literature, forces the ERD to remove gain from the system in order to ensure stability. Additional logic and design may be required in order to protect the system from excessive delays due to an attack. For example, if the system is required to drop K(t) to a significantly small value for extended periods of time, back-up equipment (e.g. PMUs at other locations) may be used to keep the system operable while the attack is investigated.

The foregoing description of the invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated.

What is claimed is:

1. A method for adjusting a High Voltage Direct Current (HVDC) feedback compensator block output signal to an HVDC system in order to reduce control loop modulus due to excessive time delay of sensor measurements used to calculate a feedback error signal received by a HVDC feedback compensator block, wherein said HVDC compensator block operations are performed on a control unit, the method comprising:

receiving by an Excessive Regeneration Detector (ERD) block R(v) said HVDC feedback compensator block output signal v(t) from said HVDC feedback compensator block C(s), wherein said ERD block R(v) operations are performed on said control unit;

discretizing by a Discretize subsystem of said ERD block R(v) said HVDC feedback compensator block output signal v(t) to create a discretized feedback compensator output signal v[n];

filtering by a Bandpass Filter subsystem of said ERD block R(v) said discretized feedback compensator output signal v[n] to produce a bandpass frequency limited compensator output signal $v_f[n]$;

calculating by an Overall Variance subsystem of said ERD block R(v) an overall HVDC system variance $\hat{\sigma}^2$ over an overall HVDC system window of said discretized feedback compensator output signal v[n];

calculating by a Short-Time Variance Window (STVW) Variance subsystem of said ERD block R(v) a STVW bandpass filtered variance $\hat{\sigma}_{1,f}^2$ over a short-time variance window of said bandpass frequency limited compensator output signal $v_f[n]$;

calculating by a STVW Divider subsystem of said ERD block R(v) a STVW quotient $g_1[n]$ of said STVW bandpass filtered variance $\hat{\sigma}_{1,f}^2$ divided by said overall HVDC system variance $\hat{\sigma}^2$;

calculating by an Extended-Time Variance Window (ETVW) Variance subsystem of said ERD block R(v) an ETVW bandpass filtered variance $\hat{\sigma}_{2,f}^2$ over an extended-time variance window of said bandpass frequency limited compensator output signal $v_f[n]$;

calculating by an ETVW Divider subsystem of said ERD block R(v) an ETVW quotient $g_2[n]$ of said ETVW bandpass filtered variance $\hat{\sigma}_{2,f}^2$ divided by said overall HVDC system variance $\hat{\sigma}^2$;

comparing by a Hypothesis Test subsystem of said ERD block R(v) said STVW quotient $g_1[n]$ and said ETVW quotient $g_2[n]$ to corresponding STVW threshold $\gamma_1$ and ETVW threshold $\gamma_2$, respectively, as administration of hypothesis tests;

setting by a Binary Logic subsystem of said ERD block R(v) based on results of said hypothesis tests administered by said Hypothesis Test subsystem a variable gain K[n] to unity (i.e., 1) for an Interval I state when neither said STVW quotient $g_1[n]$ nor said ETVW quotient $g_2[n]$ exceed said corresponding STVW threshold $\gamma_1$ and ETVW threshold $\gamma_2$, respectively;

setting by said Binary Logic subsystem based on said results of said hypothesis tests said variable gain K[n]

to a value that is a function of said STVW quotient $g_1[n]$ and a slope $m_1$ and intercept $b_1$ of a first desired gain rate of change line for Interval II and III states when said STVW quotient $g_1[n]$ exceeds said corresponding STVW threshold $\gamma_1$ irrespective of whether or not said ETVW quotient $g_2[n]$ exceeds said corresponding ETVW threshold $\gamma_2$;

setting by said Binary Logic subsystem based on said results of said hypothesis tests said variable gain K[n] to a value that is a function of said STVW quotient $g_1[n]$ and a slope $m_2$ and intercept $b_2$ of a second desired gain rate of change line for an Interval IV state when said ETVW quotient $g_2[n]$ exceeds said corresponding ETVW threshold $\gamma_2$ and said STVW quotient $g_1[n]$ does not exceed said corresponding STVW threshold $\gamma_1$;

smoothing by a Smoothing subsystem of said ERD block R(v) said variable gain K[n] with a smoothing filter as a moving average over a smoothing time window in order to provide for slower variation of said variable gain K[n];

multiplying by a Multiplier said HVDC feedback compensator block output signal v(t) times said variable gain K[n] in order to obtain an adjusted HVDC feedback compensator output signal $v_a(t)$, wherein said Multiplier operations are performed on said control unit; and operating said HVDC system in accord with said adjusted HVDC feedback compensator block output signal $v_a(t)$ from said Multiplier.

2. The method of claim 1 wherein said Bandpass Filter subsystem has a passband of 0.85 to 4.0 Hz.

3. The method of claim 1:
wherein said short-time variance window is set to approximately equal a dominant time constant of said HVDC system in order to detect rapid increases in energy;
wherein said extended-time variance window is set to approximately equal an order of base ten magnitude larger than said short-time variance window such that said extended-time variance window is less sensitive to rapid energy changes than said short-time variance window; and
wherein said overall HVDC system window is set to at least half an order of base ten magnitude larger than said extended-time variance window such that said overall HVDC system window is significantly larger than said short-time variance window and said extended-time variance window.

4. The method of claim 1 wherein said slope $m_1$ is less than said slope $m_2$.

5. The method of claim 1 wherein said setting of said variable gain K[n] to said value that is said function of said STVW quotient $g_1[n]$ and said slope $m_1$ and said intercept $b_1$ of said first desired gain rate of change line for said Interval II and III states is calculated as $K[n]=m_1 g_1[n]+b_1$.

6. The method of claim 1 wherein said setting of said variable gain K[n] to said value that is said function of said STVW quotient $g_1[n]$ and said slope $m_2$ and said intercept $b_2$ of said second desired gain rate of change line for said Interval IV state is calculated as $K[n]=m_2 g_1[n]+b_2$.

7. The method of claim 1 wherein said process of smoothing said variable gain K[n] with a smoothing filter further comprises increasing said smoothing time window for said Interval IV state when said ETVW quotient $g_2[n]$ exceeds said corresponding ETVW threshold $\gamma_2$ and said STVW quotient $g_1[n]$ does not exceed said corresponding STVW threshold $\gamma_1$ in order to further slow recovery during said Interval IV state.

8. The method of claim 1 further comprising limiting by a Gain Limit subsystem of said ERD block R(v) said variable gain K[n] to a minimum value of 0.25.

9. The method of claim 1 wherein said overall control loop further comprises:
measuring by a first Phasor Measurement Unit (PMU) a first end voltage angle of said HVDC line at a first end of said HVDC line, wherein said first Phasor Measurement Unit (PMU) is located at said first end of said HVDC line;
measuring by a second PMU a second end voltage angle of said HVDC line at a second end of said HVDC line that is opposite of said first end of said HVDC line, wherein said second PMU is located at said second end of said HVDC line;
calculating by a PMU Transfer Function block H(s) a derivative of a measured difference of said first voltage angle and said second voltage angle as a feedback signal f(s), wherein said PMU Transfer Function block H(s) operations are performed on said control unit;
subtracting by an Error Calculation Subtractor said feedback signal f(s) from a reference signal u(s) that is a desired derivative of end-to-end differences of voltage angles for said HVDC system in order to obtain an error signal e(s), wherein said Error Calculation Subtractor operations are performed on said control unit; and
operating said HVDC feedback compensator block C(s) with input of said error signal e(s) in order to obtain HVDC feedback compensator block output signal v(t), wherein said HVDC feedback compensator block C(s) operations are performed on said control unit.

10. The method of claim 1 wherein said operation of said method of claim 1 reduces said control loop modulus during a delay event without prior (i.e., a priori) knowledge of characteristics of said delay event.

11. A Wide-Area Damping Control (WADC) system that adjusts a High Voltage Direct Current (HVDC) feedback compensator block output signal to an HVDC system in order to reduce control loop modulus due to excessive time delay of sensor measurements used to calculate a feedback error signal received by a HVDC feedback compensator block, wherein said HVDC compensator block operations are performed on a control unit of said WADC system, the WADC system comprising:
said control unit, said control unit further comprising:
an Excessive Regeneration Detector (ERD) block R(v) that receives said HVDC feedback compensator block output signal v(t) from said HVDC feedback compensator block C(s), said Excessive Regeneration Detector (ERD) block R(v) further comprising:
a Discretize subsystem that discretizes said HVDC feedback compensator block output signal v(t) to create a discretized feedback compensator output signal v[n];
a Bandpass Filter subsystem that filters said discretized feedback compensator output signal v[n] to produce a bandpass frequency limited compensator output signal $v_f[n]$;
an Overall Variance subsystem that calculates an overall HVDC system variance $\hat{\sigma}^2$ over an overall HVDC system window of said discretized feedback compensator output signal v[n];
a Short-Time Variance Window (STVW) Variance subsystem that calculates a STVW bandpass filtered variance $\hat{\sigma}_{1,f}^2$ over a short-time variance window of said bandpass frequency limited compensator output signal $v_f[n]$;

a STVW Divider subsystem that calculates a STVW quotient $g_1[n]$ of said STVW bandpass filtered variance $\hat{\sigma}_{1,f}^2$ divided by said overall HVDC system variance $\hat{\sigma}^2$;

an Extended-Time Variance Window (ETVW) Variance subsystem that calculates an ETVW bandpass filtered variance $\hat{\sigma}_{2,f}^2$ over an extended-time variance window of said bandpass frequency limited compensator output signal $v_f[n]$;

an ETVW Divider subsystem that calculates an ETVW quotient $g_2[n]$ of said ETVW bandpass filtered variance $\hat{\sigma}_{2,f}^2$ divided by said overall HVDC system variance $\hat{\sigma}^2$;

a Hypothesis Test subsystem that compares said STVW quotient $g_1[n]$ and said ETVW quotient $g_2[n]$ to corresponding STVW threshold $\gamma_1$ and ETVW threshold $\gamma_2$, respectively, as administration of hypothesis tests;

a Binary Logic subsystem that sets, based on results of said hypothesis tests administered by said Hypothesis Test subsystem, a variable gain $K[n]$ to unity (i.e., 1) for an Interval I state when neither said STVW quotient $g_1[n]$ nor said ETVW quotient $g_2[n]$ exceed said corresponding STVW threshold $\gamma_1$ and ETVW threshold $\gamma_2$, respectively; said variable gain $K[n]$ to a value that is a function of said STVW quotient $g_1[n]$ and a slope $m_1$ and intercept $b_1$ of a first desired gain rate of change line for Interval II and III states when said STVW quotient $g_1[n]$ exceeds said corresponding STVW threshold $\gamma_1$ irrespective of whether or not said ETVW quotient $g_2[n]$ exceeds said corresponding ETVW threshold $\gamma_2$; and said variable gain $K[n]$ to a value that is a function of said STVW quotient $g_1[n]$ and a slope $m_2$ and intercept $b_2$ of a second desired gain rate of change line for an Interval IV state when said ETVW quotient $g_2[n]$ exceeds said corresponding ETVW threshold $\gamma_2$ and said STVW quotient $g_1[n]$ does not exceed said corresponding STVW threshold $\gamma_1$; and a Smoothing subsystem that smoothes said variable gain $K[n]$ with a smoothing filter as a moving average over a smoothing time window in order to provide for slower variation of said variable gain $K[n]$; and a Multiplier that multiplies said HVDC feedback compensator block output signal $v(t)$ times said variable gain $K[n]$ in order to obtain an adjusted HVDC feedback compensator output signal $v_a(t)$; and said HVDC system that operates in accord with said adjusted HVDC feedback compensator block output signal $v_a(t)$ from said Multiplier.

12. The WADC system of claim 11 wherein said Bandpass Filter subsystem has a passband of 0.85 to 4.0 Hz.

13. The WADC system of claim 11:
wherein said short-time variance window is set to approximately equal a dominant time constant of said HVDC system in order to detect rapid increases in energy;
wherein said extended-time variance window is set to approximately equal an order of base ten magnitude larger than said short-time variance window such that said extended-time variance window is less sensitive to rapid energy changes than said short-time variance window; and
wherein said overall HVDC system window is set to at least half an order of base ten magnitude larger than said extended-time variance window such that said overall HVDC system window is significantly larger than said short-time variance window and said extended-time variance window.

14. The WADC system of claim 11 wherein said slope $m_1$ is less than said slope $m_2$.

15. The WADC system of claim 11 wherein when said variable gain $K[n]$ is set to said value that is said function of said STVW quotient $g_1[n]$ and said slope $m_1$ and said intercept $b_1$ of said first desired gain rate of change line for said Interval II and III states is calculated as $K[n]=m_1 g_1[n]+b_1$.

16. The WADC system of claim 11 wherein when said variable gain $K[n]$ is set to said value that is said function of said STVW quotient $g_1[n]$ and said slope $m_2$ and said intercept $b_2$ of said second desired gain rate of change line for said Interval IV state is calculated as $K[n]=m_2 g_1[n]+b_2$.

17. The WADC system of claim 11 wherein said Smoothing subsystem further comprises increasing said smoothing time window for said Interval IV state when said ETVW quotient $g_2[n]$ exceeds said corresponding ETVW threshold $\gamma_2$ and said STVW quotient $g_1[n]$ does not exceed said corresponding STVW threshold $\gamma_1$ in order to further slow recovery during said Interval IV state.

18. The WADC system of claim 11 wherein said ERD block $R(v)$ further a Gain Limit subsystem that limits said variable gain $K[n]$ to a minimum value of 0.25.

19. The WADC system of claim 11 wherein further comprising:
a first Phasor Measurement Unit (PMU) that measures a first end voltage angle of said HVDC line at a first end of said HVDC line, wherein said first Phasor Measurement Unit (PMU) is located at said first end of said HVDC line;
a second PMU that measures a second end voltage angle of said HVDC line at a second end of said HVDC line that is opposite of said first end of said HVDC line, wherein said second PMU is located at said second end of said HVDC line;
a PMU Transfer Function block $H(s)$ on said control unit that calculates a derivative of a measured difference of said first voltage angle and said second voltage angle as a feedback signal $f(s)$;
an Error Calculation Subtractor on said control unit that subtracts said feedback signal $f(s)$ from a reference signal $u(s)$ that is a desired derivative of end-to-end differences of voltage angles for said HVDC system in order to obtain an error signal $e(s)$; and
said HVDC feedback compensator block $C(s)$ on said control unit that operates with input of said error signal $e(s)$ in order to obtain HVDC feedback compensator block output signal $v(t)$.

20. The WADC system of claim 11 wherein said operation of said WADC system of claim 11 reduces said control loop modulus during a delay event without prior (i.e., a priori) knowledge of characteristics of said delay event.

* * * * *